United States Patent
Ohtsuki et al.

(10) Patent No.: US 9,386,248 B2
(45) Date of Patent: Jul. 5, 2016

(54) SOLID-STATE IMAGING DEVICE

(71) Applicant: PANASONIC INTELLECTUAL PROPERTY MANAGEMENT CO., LTD., Osaka (JP)

(72) Inventors: Hirohisa Ohtsuki, Toyama (JP); Akira Tanaka, Kanagawa (JP); Ryohei Miyagawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/554,037

(22) Filed: Nov. 25, 2014

(65) Prior Publication Data

US 2015/0077606 A1    Mar. 19, 2015

Related U.S. Application Data

(63) Continuation of application No. PCT/JP2013/003751, filed on Jun. 14, 2013.

(30) Foreign Application Priority Data

Jun. 26, 2012    (JP) .................................. 2012-143493

(51) Int. Cl.
  *H04N 5/374*    (2011.01)
  *H01L 27/146*   (2006.01)
  *H04N 5/3745*   (2011.01)

(52) U.S. Cl.
  CPC .......... *H04N 5/3741* (2013.01); *H01L 27/1464* (2013.01); *H01L 27/14603* (2013.01);

(Continued)

(58) Field of Classification Search
  CPC ................... H01L 27/14603; H01L 27/14636; H01L 27/14638; H01L 27/14665; H01L 27/1464; H04N 5/3577; H04N 5/369
  See application file for complete search history.

(56) References Cited

U.S. PATENT DOCUMENTS

2007/0069164 A1*   3/2007   Imai .................. H01L 27/14603
                                                         250/591
2009/0224162 A1    9/2009   Inuiya et al.

(Continued)

FOREIGN PATENT DOCUMENTS

JP    10-093066 A    4/1998
JP    11-121731 A    4/1999

(Continued)

OTHER PUBLICATIONS

International Search Report issued in International Application No. PCT/JP2013/003751 with Date of mailing Aug. 20, 2013, with English Translation.

*Primary Examiner* — Paul Berardesca
(74) *Attorney, Agent, or Firm* — McDermott Will & Emery LLP

(57) ABSTRACT

A pixel includes: a photoelectric conversion unit that photoelectrically converts incident light and has an upper electrode, a lower electrode, and a photoelectric conversion film interposed between the upper electrode and the lower electrode; an amplifying transistor that outputs a signal according to an amount of a signal charge generated in the photoelectric conversion unit; a charge transfer line that connects the lower electrode and the amplifying transistor; and an output line that outputs the signal from the amplifying transistor, wherein at least a part of the output line is disposed to overlap the lower electrode without another line interposed therebetween.

11 Claims, 6 Drawing Sheets

(52) U.S. Cl.
 CPC .... *H01L27/14636* (2013.01); *H01L 27/14638* (2013.01); *H01L 27/14643* (2013.01); *H01L 27/14665* (2013.01); *H04N 5/37457* (2013.01)

(56) References Cited

U.S. PATENT DOCUMENTS

| | | | |
|---|---|---|---|
| 2012/0292490 A1* | 11/2012 | Sanson | H01L 27/14603 250/214.1 |
| 2013/0015324 A1* | 1/2013 | Park | H01L 27/14641 250/208.1 |
| 2013/0113060 A1 | 5/2013 | Matsunaga | |

FOREIGN PATENT DOCUMENTS

| | | |
|---|---|---|
| JP | 2002-050752 A | 2/2002 |
| JP | 2009-212377 A | 9/2009 |
| WO | 2012/005014 A1 | 1/2012 |

* cited by examiner

SOLID-STATE IMAGING DEVICE

CROSS REFERENCE TO RELATED APPLICATIONS

This is a continuation application of PCT International Application No. PCT/JP2013/003751 filed on Jun. 14, 2013, designating the United States of America, which is based on and claims priority of Japanese Patent Application No. 2012-143493 filed on Jun. 26, 2012. The entire disclosures of the above-identified applications, including the specifications, drawings and claims are incorporated herein by reference in their entirety.

FIELD

One or more exemplary embodiments disclosed herein relate generally to solid-state imaging devices.

BACKGROUND

The following will describe a solid-state imaging device (image sensor) according to a conventional technique with reference to FIG. 10. FIG. 10 is a layout diagram of a unit cell (pixel) in a photoelectric conversion device in Patent Literature (PTL) 1 (Japanese Unexamined Patent Application Publication No. 2002-50752) as a solid-state imaging device in the conventional technique.

In the photoelectric conversion device, as illustrated in FIG. 10, a plurality of unit cells are arranged, each of the cells includes a photoelectric conversion element 401, a floating diffusion (FD) region 400 that holds a charge photoelectrically converted by the photoelectric conversion element 401, an amplifier 403 that amplifies a signal according to the charge of the FD region 400 to output the signal, and an FD line 406 that connects the FD region 400 and an input portion of the amplifier 403. This photoelectric conversion device is characterized by arranging FD lines 406 and 406' adjacent to each other in the respective adjacent unit cells.

SUMMARY

Technical Problem

The conventional technique as illustrated in FIG. 10 makes it possible to reduce parasitic capacitance generated between the FD line and a signal line, and achieve high S/N by increasing conversion efficiency of a light charge (a signal charge). However, this conventional technique is not sufficient as a measure to reduce parasitic capacitance because this conventional technique only reduces the parasitic capacitance on one side of the unit cell and does not consider the parasitic capacitance disposed on the other side of the unit cell due to a line of a fixed potential.

Furthermore, with the miniaturization of a pixel size, recent years have seen a number of proposals for increasing the aperture ratio of the light conversion element with respect to a chip area of the solid-state imaging device, to obtain a high signal output. One of the proposals draws attention since it is a stacked solid-state imaging device in which a photoelectric conversion element is not provided on a surface portion of a semiconductor substrate, and a signal readout circuit is only provided on the surface portion of the semiconductor substrate, and a photoelectric conversion film is provided above the semiconductor substrate. However, it is not possible to increase S/N characteristics since parasitic capacitance does not decrease even when the conventional technique as illustrated in FIG. 10 is used in the solid-state imaging device having a photoelectric conversion film.

Solution to Problem

In one general aspect, the techniques disclosed here feature is a solid-state imaging device comprising a pixel region in which a plurality of pixels are two-dimensionally arranged, each of the plurality of pixels including: a photoelectric conversion unit configured to photoelectrically convert incident light, the photoelectric conversion unit having an upper electrode, a lower electrode, and a photoelectric conversion film disposed between the upper electrode and the lower electrode; an amplifying transistor that outputs a signal corresponding to an amount of a signal charge generated by the photoelectric conversion unit; a charge transfer line that connects the lower electrode and the amplifying transistor; and an output line that outputs a signal from the amplifying transistor, wherein at least a part of the output line is disposed to overlap the lower electrode without another line interposed therebetween.

General and specific aspects disclosed above may be implemented using a system, a method, an integrated circuit, a computer program, or a computer-readable recording medium such as a CD-ROM, or any combination of systems, methods, integrated circuits, computer programs, or computer-readable recording media.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
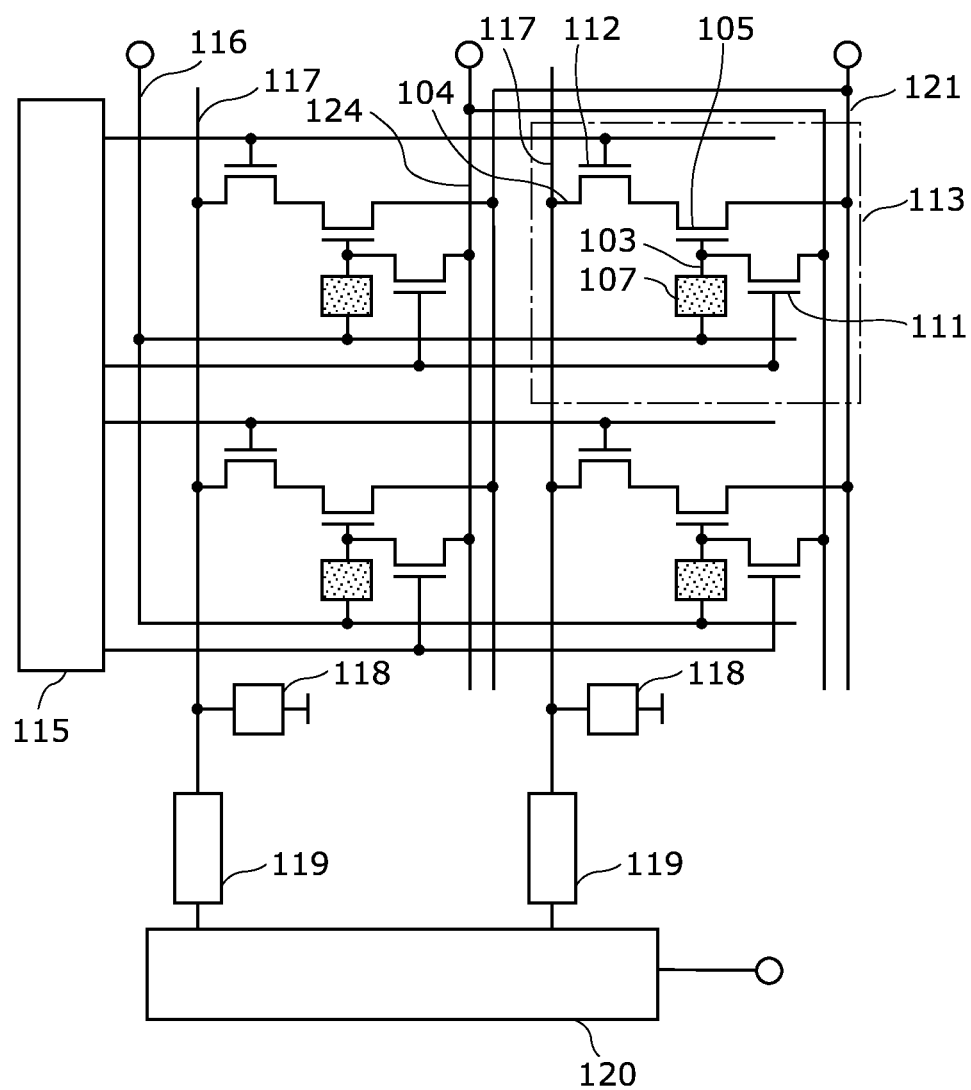
FIG. 1 is a circuit diagram illustrating a configuration of a solid-state imaging device according to Embodiment 1.

Hereinafter, certain exemplary embodiments are described in greater detail with reference to the accompanying Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Certain exemplary embodiments are specified by Claims. Therefore, among the structural elements in the following exemplary embodiments, structural elements not recited in any one of the independent claims are described as arbitrary structural elements. In the Drawings, the same reference signs are assigned to structural elements showing the effectively same configuration, operation, and effect.

Embodiment 1

First, an overall configuration and operation of a solid-state imaging device according to Embodiment 1 will be described.

FIG. 1 is a circuit diagram of the solid-state imaging device according to Embodiment 1.

The solid-state imaging device according to Embodiment 1 is a stacked solid-state imaging device, and includes a semiconductor substrate, a pixel region (pixel unit) in which a plurality of pixels 113 are two-dimensionally arranged on the main surface of the semiconductor substrate, and a drive circuit unit that sequentially drives the pixels 113 to take out a signal from each of the pixels 113.

The drive circuit unit comprises a vertical scanning unit (row scanning circuit) 115, a control line 116, a vertical signal line 117, a load unit 118, a column signal processing unit 119, a horizontal scanning unit (column scanning circuit) 120, a power supply line (source follower power supply) 121, and a reset line 124.

The pixel 113 includes a photoelectric conversion unit 107, an amplifying transistor 105, a reset transistor 111, and an address transistor (row selection transistor) 112.

The photoelectric conversion unit 107 performs photoelectric conversion on incident light, and generates and stores a signal charge corresponding to an amount of the incident light. The amplifying transistor 105 outputs a signal voltage corresponding to the amount of signal charge generated by the photoelectric conversion unit 107. The reset transistor 111 resets (initializes) the photoelectric conversion unit 107, that is to say, a potential of the gate electrode of the amplifying transistor 105. The address transistor 112 selectively outputs a signal voltage from the pixel 113 in a predetermined row to the vertical signal line 117.

The vertical scanning unit 115 scans rows of the pixel 113 in a vertical direction (column direction) and selects a row of the pixel 113 to output a signal voltage to the vertical signal line 117, by applying a row selection signal that controls ON and OFF of the address transistor 112 to the gate electrode of the address transistor 112. The vertical scanning unit 115 selects a row of the pixel 113 to perform a reset operation by applying a reset signal that controls ON and OFF of the reset transistor 111 to the gate electrode of the reset transistor 111.

The control line 116 is commonly connected to all the pixels 113, for example, and applies the same positive constant voltage to all the photoelectric conversion units 107.

The vertical signal line 117 is provided corresponding to a column of the pixel 113, is connected to a source, for example, of the address transistor 112 of the pixel 113 in a corresponding column, is disposed in a column direction (vertical direction in FIG. 1), and transmits a signal voltage in a column direction.

A load unit 118 is provided corresponding to each of the vertical signal lines 117, and is connected to a corresponding one of the vertical signal lines 117. The load unit 118 constitutes a source follower circuit with the amplifying transistor 105.

The column signal processing unit 119 performs noise suppression signal processing and analog-to-digital (AD) conversion as represented by correlated double sampling. The column signal processing unit 119 is provided corresponding to each of the vertical signal lines 117, and is connected to a corresponding one of the vertical signal lines 117.

The horizontal scanning unit 120 sequentially reads out a signal of each of the column signal processing units 119 provided in a horizontal direction (row direction) to a horizontal common signal line (not illustrated in the drawing).

The power supply line 121 is connected to a drain of the amplifying transistor 105, for example, and is disposed in a column direction. The power supply line 121 commonly applies a source follower power supply voltage to the amplifying transistors 105 of all the pixels 113, for example.

The reset line 124 is connected to a drain of the reset transistor 111, for example, and is disposed in a column direction. The reset line 124 commonly applies a reset voltage to the reset transistors 111 of all the pixels 113, for example.

In the solid-state imaging device having the aforementioned configuration, in the pixel 113 on a row selected by the vertical scanning unit 115, a signal voltage corresponding to a signal charge photoelectrically converted by the photoelectric conversion unit 107 is amplified by the amplifying transistor 105, and is outputted to the vertical signal line 117 via the address transistor 112. After the outputted signal voltage is stored as an electric signal in the column signal processing unit 119, the signal voltage is selected by the horizontal scanning unit 120 and then is outputted. Subsequently, the signal charge in the pixel 113 that outputted the signal charge are discharged by turning ON the reset transistor 111.

Next, a detail of the configuration of the pixel 113 will be described.

Figure 2:
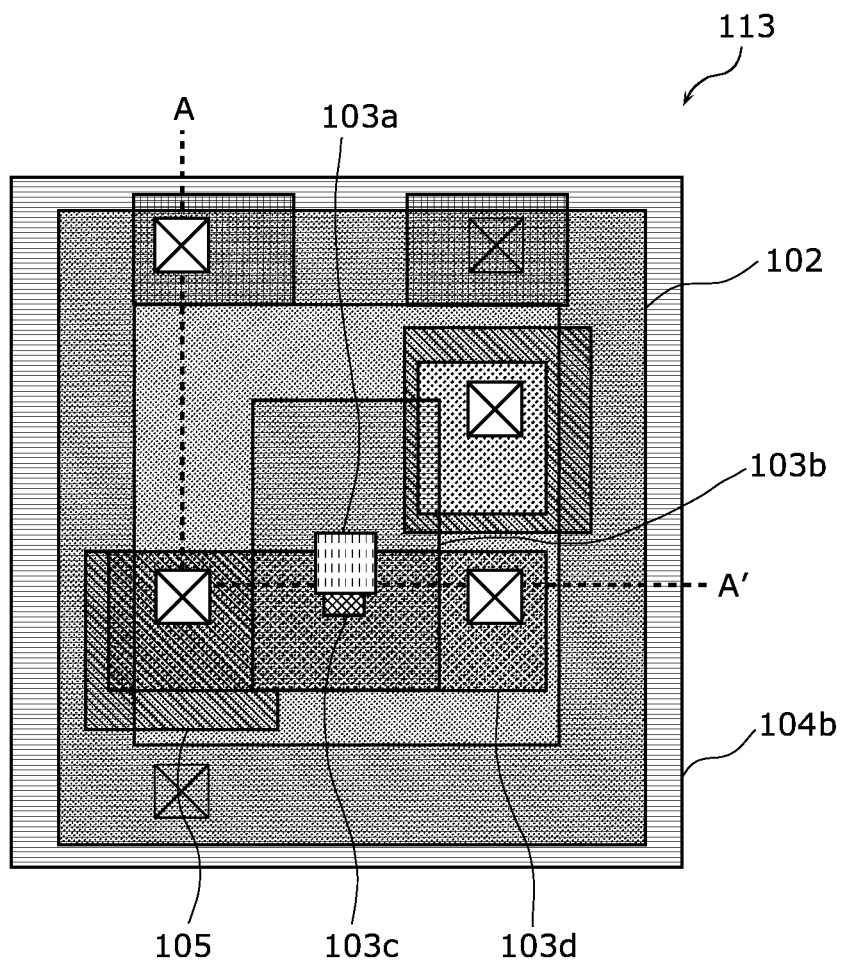
FIG. 2 is a layout diagram schematically illustrating a configuration of a pixel in the solid-state imaging device according to Embodiment 1.

FIG. 2 is a layout diagram schematically illustrating a configuration of the pixel 113 of the solid-state imaging device according to Embodiment 1. It should be noted that FIG. 2 illustrates a layout of an electrode and a line on the semiconductor substrate when the pixel 113 is viewed from above the semiconductor substrate, and illustrates a state in which an upper electrode and a photoelectric conversion film are removed.

Figure 3:
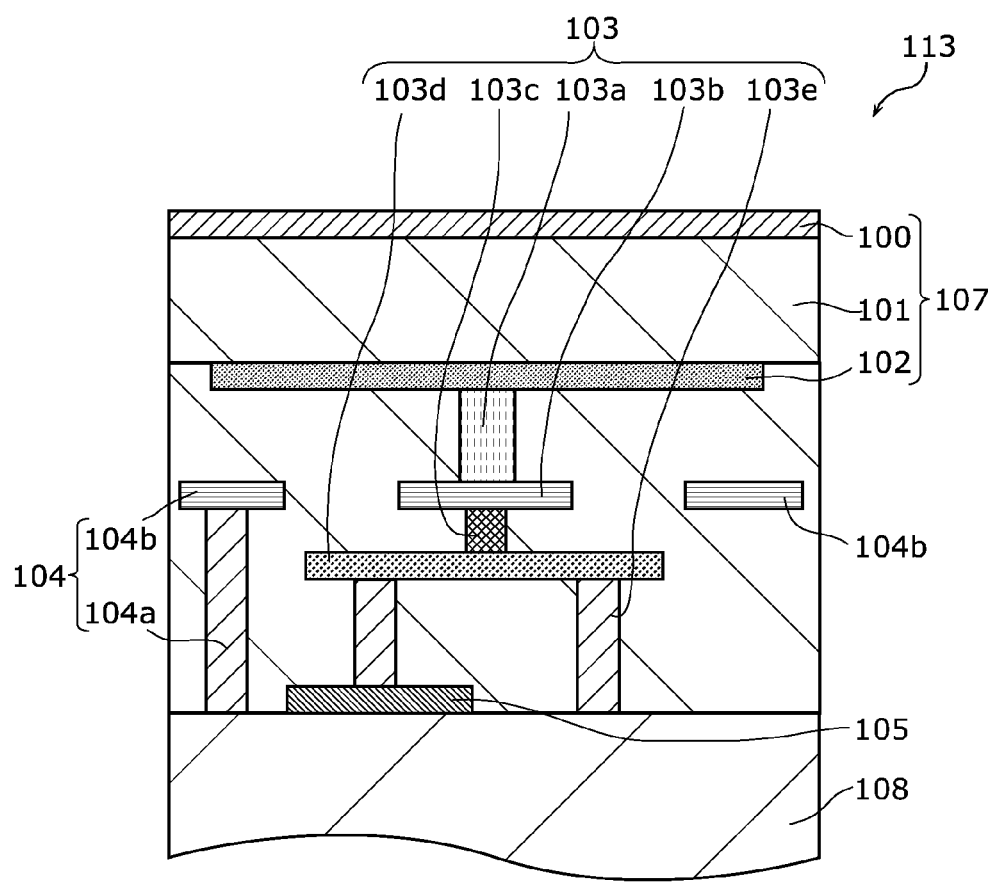
FIG. 3 is a cross-sectional view schematically illustrating a configuration of a pixel in the solid-state imaging device according to Embodiment 1.

FIG. 3 is a cross-sectional view schematically illustrating a configuration of a pixel in the solid-state imaging device according to Embodiment 1. It should be noted that FIG. 3 is a cross-sectional view of A-A' in the pixel 113 in FIG. 2, and illustrates a positional relationship among the upper electrode, the photoelectric conversion film, the lower electrode, a charge transfer line, the amplifying transistor, and an output line.

Figure 4:
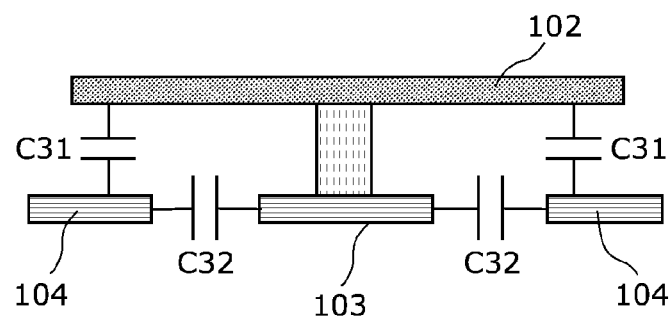
FIG. 4 is a cross-sectional view schematically illustrating parasitic capacitance formed in a pixel of the solid-state imaging device according to Embodiment 1.

FIG. 4 is a cross-sectional view schematically illustrating parasitic capacitance formed in a pixel in the solid-state imaging device according to Embodiment 1. It should be noted that FIG. 4 illustrates parasitic capacitance between the lower electrode and the output line and parasitic capacitance between the charge transfer line and the output line.

The pixel 113, as illustrated in FIG. 2 and FIG. 3, includes the photoelectric conversion unit 107 that photoelectrically converts incident light, and the photoelectric conversion unit 107 includes an upper electrode 100, a lower electrode 102, and a photoelectric conversion film 101 disposed between the upper electrode 100 and the lower electrode 102. The pixel 113 further includes the amplifying transistor 105 that outputs a signal (signal voltage) corresponding to the amount of charge (the amount of signal charge) that is generated by the photoelectric conversion unit 107, the charge transfer line (FD line) 103 that connects the lower electrode 102 and the amplifying transistor 105, and the output line (signal line) 104 that outputs a signal from the amplifying transistor 105. There is a region in which there is no line between the lower electrode 102 and the output line 104 (line 104b), and at least a part of the output line 104 (line 104b) is disposed to overlap the lower electrode 102 without another line interposed therebetween when viewed from above the semiconductor substrate 108. In other words, at least a part of the output line 104 (line 104b) is disposed to overlap the lower electrode 102 without another line interposed therebetween in a stacked direction of a wiring layer. Moreover, the output line 104 (line 104b) is disposed in the first wiring layer that is the wiring layer closest to the lower electrode 102. Moreover, the output line 104 (line 104b) is disposed to surround the charge transfer line 103 (line 103b) when viewed from above the semiconductor substrate 108. With this configuration, it is possible to provide a solid-state imaging device that achieves high S/N.

The photoelectric conversion unit 107 interposes an interlayer insulating layer that is provided by stacking a plurality of wiring layers, and is disposed above the semiconductor substrate 108 in which the amplifying transistor 105 is formed.

The pixel 113 includes the photoelectric conversion film 101 that generates the charge corresponding to the amount of light received, and a charge transfer line 103 that is connected to the gate electrode of the amplifying transistor 105 and that transfers the signal charge of the photoelectric conversion film 101 to the gate electrode of the amplifying transistor 105. The pixel 113 further includes the amplifying transistor 105 that outputs, to the output line 104, a voltage signal at a level corresponding to the amount of charge transferred to the gate electrode, and the output line 104 that outputs a signal outputted from the amplifying transistor 105 to the vertical signal line 117. For example, the output line 104 is connected to the drain of the amplifying transistor 105, and the amplifying transistor 105 outputs a voltage signal at a level corresponding to a potential of the gate electrode from the drain.

The charge transfer line 103 includes a line 103b disposed in the first wiring layer, and a line 103d disposed in the second wiring layer that is the wiring layer second closest to the lower electrode 102. The charge transfer line 103 further includes a contact 103a that connects the lower electrode 102 and the line 103b, a contact 103c that connects the line 103b and the line 103d, and a contact 103e that connects the gate electrode of the amplifying transistor 105 and the line 103d. The line 103d connects the lower electrode 102 and the amplifying transistor 105, and connects the lower electrode 102 and the reset transistor 111.

The output line 104 includes a line 104b that is disposed in the same wiring layer as the line 103b (first wiring layer), and a contact 104a that connects the amplifying transistor 105 and the line 104b. The line 104b is formed in a ring shape to surround four sides of the charge transfer line 103 (line 103b) when viewed from above the semiconductor substrate 108. Moreover, the line 104b is formed such that the outer edge of the lower electrode 102 is encircled with the outer edge of the line 104b and the inner edge of the line 104b is encircled with the outer edge of the lower electrode 102, when viewed from the semiconductor substrate 108. Moreover, the line 104b is disposed on either side of the charge transfer line 103 in the first wiring layer, when viewed laterally from the semiconductor substrate 108.

In the pixel 113 having the aforementioned configuration, the output line 104 is disposed to overlap the lower electrode 102. When a signal is read out into the vertical signal line 117 (when data is read out), a potential of the output line 104 changes via the charge transfer line 103 according to the potential change by an amplified amount of the potential change of the lower electrode 102. Therefore, parasitic capacitance C31 and parasitic capacitance C32, each of which is located between (i) the charge transfer line 103 having the same potential as the lower electrode 102 and (ii) the output line 104, are almost invisible. In other words, parasitic capacitance C31 and parasitic capacitance C32 are generated by a potential difference between (i) the output line 104 and (ii) the lower electrode 102 and the charge transfer line 103. However, the potential of the lower electrode 102 and the charge transfer line 103 changes according to the potential of the output line 104. Therefore, by disposing the output line 104 in the first wiring layer closest to the lower electrode 102, it is possible to reduce the potential difference between (i) the output line 104 and (ii) the lower electrode 102 and the charge transfer line 103, and make parasitic capacitance C31 and parasitic capacitance C32 relatively small. With this, since parasitic capacitance of the output line 104 with respect to the lower electrode 102 and the charge transfer line 103 can be small while an amplitude of a signal to be transferred to the amplifying transistor 105 can be large, it is possible to increase S/N because the amplitude of the signal to be transferred to the amplifying transistor 105 is difficult to be affected by noise.

Figure 5:
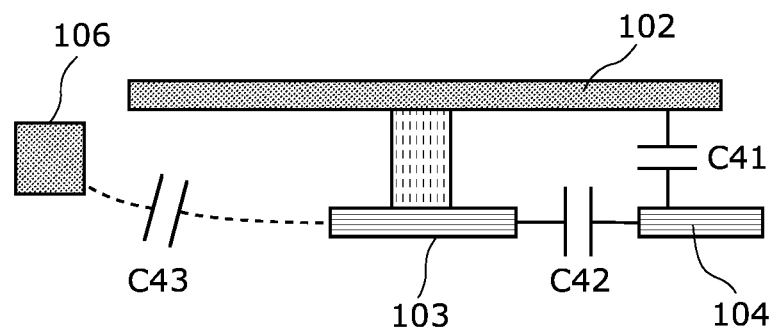
FIG. 5 is a cross-sectional view schematically illustrating parasitic capacitance formed in a pixel in a comparison example of the solid-state imaging device according to Embodiment 1.

FIG. 5 is a cross-sectional view schematically illustrating parasitic capacitance formed in a pixel in a comparison example of the solid-state imaging device according to Embodiment 1. Specifically, FIG. 5 is a diagram schematically illustrating parasitic capacitance formed in the pixel 113 when the output line 104 is disposed only on one side of the charge transfer line 103 when viewed laterally from the semiconductor substrate 108. It should be noted that FIG. 5 illustrates fringe capacitance C43 from another line 106 for driving the solid-state imaging device that is influenced by the charge transfer line 103, along with the parasitic capacitance due to the output line 104.

In FIG. 5, parasitic capacitance C41 and parasitic capacitance C42 due to the output line 104 are capacitance from only one side of the charge transfer line 103. However, since the fringe capacitance C43 is capacitance from a plurality of other sides of the charge transfer line 103, the influence is larger.

Conversely, in the pixel 113 according to the present embodiment, as illustrated in FIG. 2, the output line 104 is disposed to surround four sides of the charge transfer line 103 in the first wiring layer. In other words, as illustrated in FIG. 3, in the first wiring layer, the output line 104 is disposed on either side of the charge transfer line 103. Therefore, the generation of parasitic capacitance with another line 106 can be further reduced, parasitic capacitance with respect to the charge transfer line 103 can be further suppressed, and S/N can be further increased.

As described above, in the pixel 113 in the present embodiment, the output line 104 and the charge transfer line 103 are disposed adjacent to each other in the same first wiring layer. Therefore, parasitic capacitance generated between the charge transfer line 103 and the output line 104 can be small, and conversion efficiency of signal charge can be increased. In other words, conversion gain can be increased, and high S/N can be achieved.

In other words, in the pixel 113 in the present embodiment, the charge transfer line 103 is connected to the lower surface of the lower electrode 102. The photoelectric conversion film 101 disposed between the upper electrode 100 and the lower electrode 102 generates a signal charge, and transfers the signal charge via the lower electrode 102 to the charge transfer line 103. At that time, a signal voltage V is generated in the charge transfer line 103 according to an amount of charge Q generated in the photoelectric conversion film 101. This signal voltage V is transmitted to the amplifying transistor 105 and is amplified by the amplifying transistor 105, and then is outputted by the output line 104. At this time, since parasitic capacitance generated between the lower electrode 102 and another line 106 is small, the signal amplitude of the charge transfer line 103 connected to the lower electrode 102 at the same potential is small. This is the solution to the problem that S/N becomes worse. In other words, the transformation formula of the signal voltage V can be represented by V=Q/Ctr using parasitic capacitance Ctr of the charge transfer line 103. However, since the value of parasitic capacitance Ctr of the charge transfer line 103 is small, it is possible to prevent the voltage transmitted to the amplifying transistor 105 from being small and it is possible to achieve high S/N.

As described above, in the solid-state imaging device in the present embodiment, the output line 104 is disposed in the first wiring layer closest to the lower electrode 102, and the output line 104 is disposed to surround four sides of the charge transfer line 103 in the first wiring layer. Therefore, it is possible to increase S/N by relatively and efficiently suppressing parasitic capacitance of the charge transfer line 103 to increase conversion efficiency of a signal charge.

Embodiment 2

Next, a configuration and an operation of a solid-state imaging device according to Embodiment 2 will be described by focusing on the difference from Embodiment 1.

The solid-state imaging device according to the present embodiment is different from the solid-state imaging device according to Embodiment 1 in the configuration of the pixel. By replacing the pixel 113 with a pixel 213 in FIG. 1, the pixel in Embodiment 2 is configured as a whole.

Figure 6:
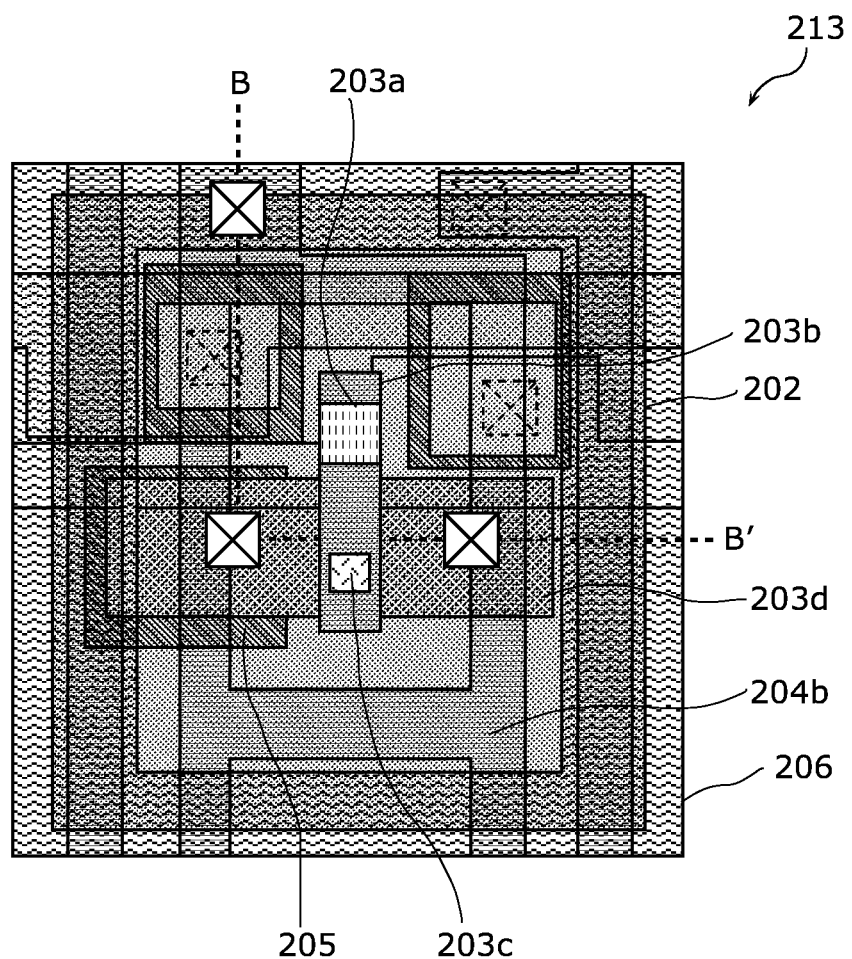
FIG. 6 is a layout diagram schematically illustrating a configuration of a pixel in a solid-state imaging device according to Embodiment 2.

FIG. 6 is a layout diagram schematically illustrating a configuration of the pixel 213 in the solid-state imaging device according to Embodiment 2. It should be noted that FIG. 6 illustrates a layout of an electrode and a wiring on the semiconductor substrate when the pixel 213 is viewed from above the semiconductor substrate, and illustrates a state in which an upper electrode and a photoelectric conversion film are removed.

Figure 7:
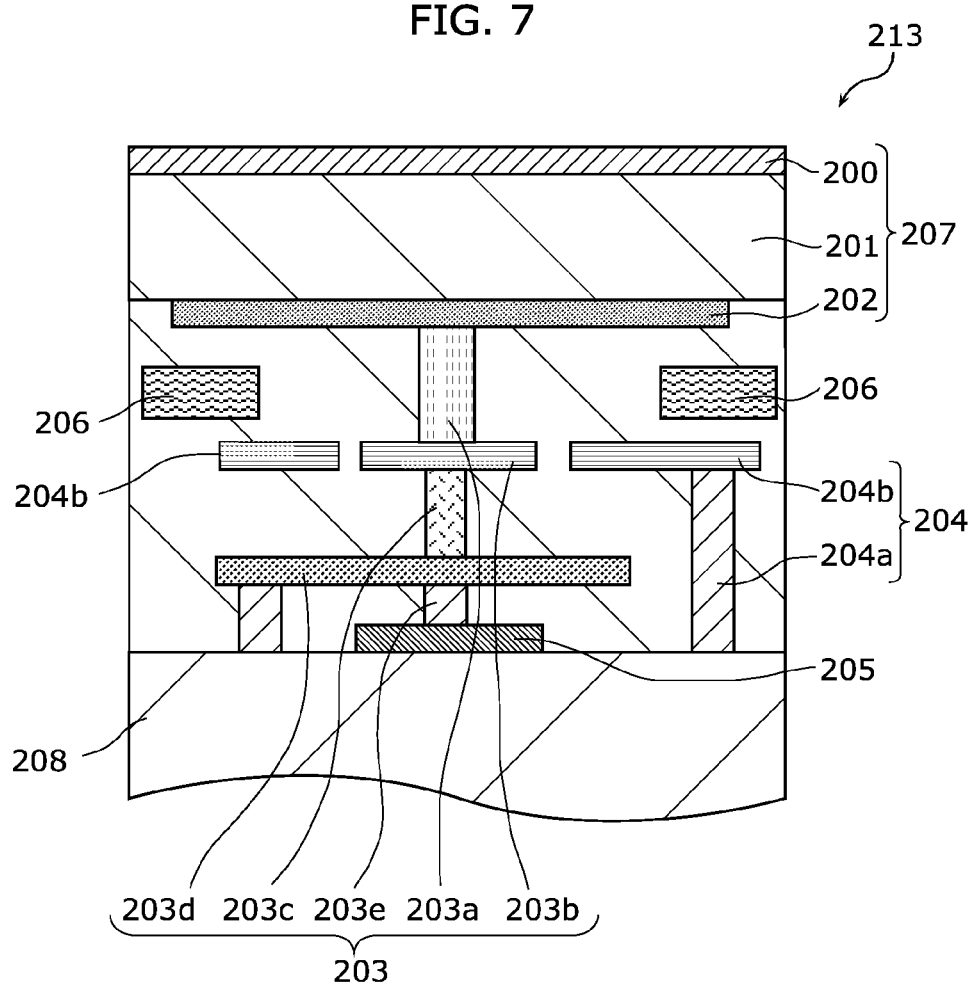
FIG. 7 is a cross-sectional view schematically illustrating a configuration of a pixel in the solid-state imaging device according to Embodiment 2.

FIG. 7 is a cross-sectional view schematically illustrating a configuration of a pixel in the solid-state imaging device according to Embodiment 2. It should be noted that FIG. 7 is a cross-sectional view of B-B' in the pixel 213 in FIG. 6, and illustrates a positional relationship among the upper electrode, the photoelectric conversion film, the lower electrode, the charge transfer line, the amplifying transistor, the output line, and the other line.

Figure 8:
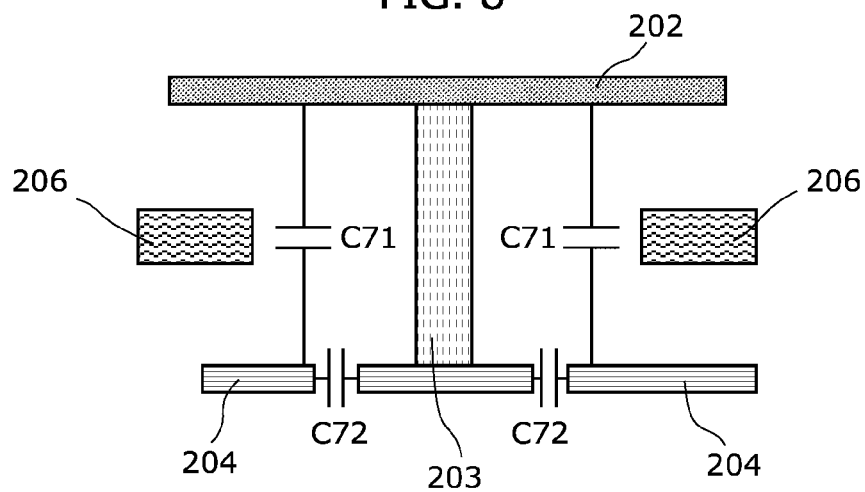
FIG. 8 is a cross-sectional view schematically illustrating parasitic capacitance formed in a pixel in the solid-state imaging device according to Embodiment 2.

FIG. 8 is a cross-sectional view schematically illustrating parasitic capacitance formed in a pixel in the solid-state imaging device according to Embodiment 2. It should be noted that FIG. 8 illustrates parasitic capacitance between the lower electrode and the output line and parasitic capacitance between the charge transfer line and the output line in the pixel 213 in FIG. 7.

The pixel 213, as illustrated in FIG. 6 and FIG. 7, includes a photoelectric conversion unit 207 that photoelectrically converts incident light, and the photoelectric conversion unit 207 includes an upper electrode 200, a lower electrode 202, and a photoelectric conversion film 201 disposed between the upper electrode 200 and the lower electrode 202. The pixel 213 further includes an amplifying transistor 205 that outputs a signal corresponding to the amount of charge generated by the photoelectric conversion unit 207, a charge transfer line 203 that connects the lower electrode 202 and the amplifying transistor 205, and an output line 204 that outputs a signal from the amplifying transistor 205. There is a region in which there is not another line 206 between the lower electrode 202 and the output line 204 (line 204b), and at least a part of the output line 204 (line 204b) is disposed to overlap the lower electrode 202 without another line 206 interposed therebetween when viewed from above the semiconductor substrate 208. In other words, at least a part of the output line 204 (line 204b) is disposed to overlap the lower electrode 202 without another line 206 interposed therebetween in a stacked direction of a wiring layer. Moreover, the output line 204 (line 204b) is disposed in the second wiring layer second closest to the lower electrode 202. However, since another line 206 in the first wiring layer that is the wiring layer closest to the lower electrode 202 is not disposed between a part of the output line 204 (line 204b) and the lower electrode 202, the lower electrode 202 is disposed above an end portion of the output line 204 (line 204b). With this configuration, it is possible to suppress parasitic capacitance between (i) the output line 204 (line 204b) in the second wiring layer and (ii) the lower electrode 202 and the charge transfer line 203, and to provide a solid-state imaging device that achieves high S/N.

The photoelectric conversion unit 207 interposes an interlayer insulating layer in which a plurality of wiring layers are formed, and is disposed above the semiconductor substrate 208 in which the amplifying transistor 205 is formed.

The pixel 213 includes the photoelectric conversion film 201 that generates the charge corresponding to the amount of light received, and a charge transfer line 203 that is connected to the gate electrode of the amplifying transistor 205 and that transfers the signal charge of the photoelectric conversion film 201 to the gate electrode of the amplifying transistor 205. The pixel 213 further includes the amplifying transistor 205 that outputs, to the output line 204, a voltage signal at a level corresponding to the amount of charge transferred to the gate electrode, the output line 204 that outputs a signal outputted from the amplifying transistor 205 to the vertical signal line 117, and another line 206 that is other than the output line 204 and the charge transfer line 203. For example, the output line 204 is connected to the drain of the amplifying transistor 205, and the amplifying transistor 205 outputs a voltage signal at a level corresponding to a potential of the gate electrode from the drain.

The charge transfer line 203 includes a line 203b disposed in the second wiring layer, and a line 203d disposed in the third wiring layer that is the wiring layer third closest to the lower electrode 202. The charge transfer line 203 further includes a contact 203a that connects the lower electrode 202 and the line 203b, a contact 203c that connects the line 203b and the line 203*d*, and a contact 203*e* that connects the gate electrode of the amplifying transistor 205 and the line 203*d*. The line 203*d* connects the lower electrode 202 and the amplifying transistor 205, and connects the lower electrode 202 and the reset transistor.

The output line 204 includes a line 204*b* that is disposed in the same wiring layer as the line 203*b* (second wiring layer), and a contact 204*a* that connects the amplifying transistor 205 and the line 204*b*. The line 204*b* is formed in a ring shape to surround four sides of the charge transfer line 203 (line 203*b*) when viewed from above the semiconductor substrate 208. Moreover, the line 204*b* is also formed such that the inner edge of the line 204*b* is encircled with the outer edge of the lower electrode 202, when viewed from the semiconductor substrate 208. Moreover, the line 204*b* is disposed on either side of the charge transfer line 203 in the second wiring layer, when viewed laterally from the semiconductor substrate 208.

The line 206 is disposed in the first wiring layer, and a part of the line 206 overlaps the lower electrode 202 and the line 204*b* when viewed from above the semiconductor substrate 208.

In the pixel 213 in the present embodiment, the output line 204 is disposed in the second wiring layer. The difference from the pixel 113 in Embodiment 1 is that in the pixel 213, the line 206 in the first wiring layer is not disposed between a part of the output line 204 and the lower electrode 202.

In other words, in the pixel 113 in the aforementioned Embodiment 1, the output line 204 is disposed in the first wiring layer closest to the lower electrode 202. In the pixel 213 in the present embodiment, as illustrated in FIG. 7, the output line 204 is disposed in the second wiring layer second closest to the lower electrode 202. At this time, the line 206 in the first wiring layer is not disposed between a part of the output line 204 and the lower electrode 202. In other words, the line of the second wiring layer, in other words, a part of the output line 204 is located just under the lower electrode 202.

In this configuration, another line 206 that is other than the output line 204 is disposed in the first wiring layer. Even with this configuration, however, a part of the output line 204 is disposed to overlap the lower electrode 202, and the potential of the output line 204 changes according to the potential change of the lower electrode 202. Therefore, as illustrated in FIG. 8, parasitic capacitance C71 and parasitic capacitance C72 when viewed from the charge transfer line 203 look relatively small. With this, since the amplitude of a signal to be transferred to the amplifying transistor 205 can be large, it is possible to increase S/N because the amplitude of the signal to be transferred to the amplifying transistor 205 is difficult to be affected by noise.

Conversely, in the pixel 213 according to the present embodiment, as illustrated in FIG. 6, the output line 204 is disposed to surround four sides of the charge transfer line 203 in the second wiring layer. In other words, as illustrated in FIG. 7, in the second wiring layer, the output line 204 is disposed on either side of the charge transfer line 203. Therefore, the generation of parasitic capacitance with another line 206 can be further reduced, parasitic capacitance with respect to the charge transfer line 203 can be further suppressed, and S/N can be further increased.

As described above, in the solid-state imaging device in the present embodiment, the output line 204 is disposed to surround four sides of the charge transfer line 203 in the second wiring layer. The line 206 in the first wiring layer is not disposed between a part of the output line 204 and the lower electrode 202. Therefore, it is possible to increase S/N by relatively and efficiently suppressing parasitic capacitance of the charge transfer line 203 to increase conversion efficiency of a signal charge.

Embodiment 3

Next, an imaging device (camera) according to Embodiment 3 will be described.

Figure 9:
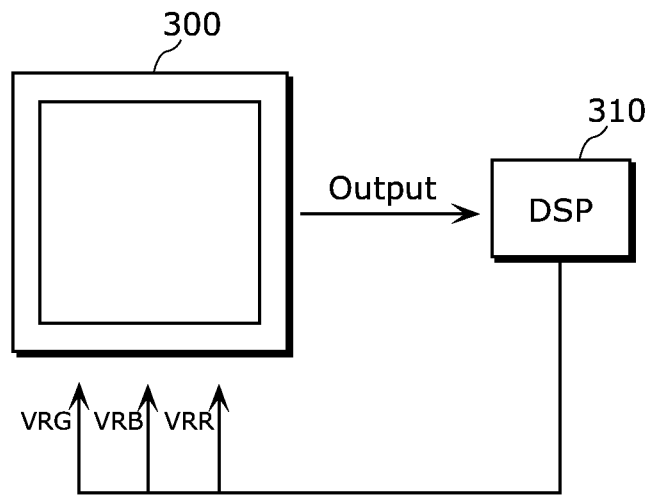
FIG. 9 is a signal flow diagram in an imaging device according to Embodiment 3.
Figure 10:
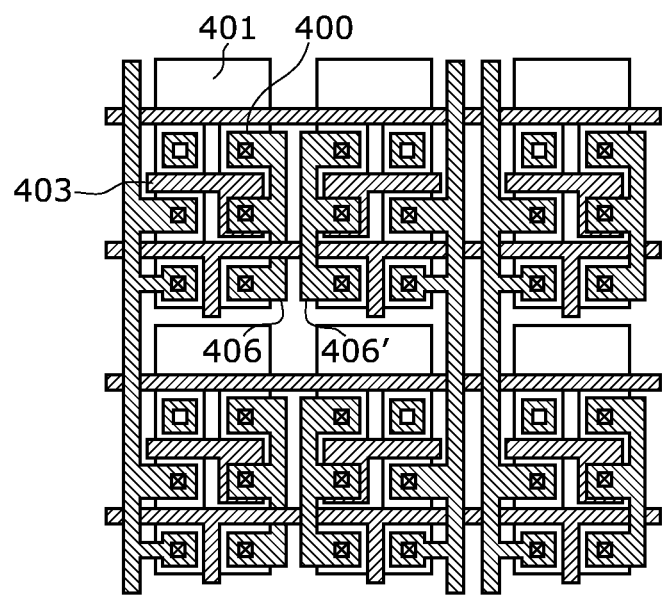
FIG. 10 is a layout diagram illustrating a configuration of a pixel according to a conventional technique.

FIG. 9 is a signal flow diagram in an imaging device according to Embodiment 3.

This imaging device includes a solid-state imaging device 300 in the aforementioned Embodiments 1 and 2. A signal outputted from this solid-state imaging device 300 is processed by a digital signal processor (DSP) 310. With this process, an appropriate reset voltage is calculated, and is fed back to the solid-state imaging device 300.

It should be noted that the solid-state imaging device 300 and the DSP 310 can be manufactured as a single semiconductor device. With this, it is possible to miniaturize an imaging device as an electronic device using the solid-state imaging device 300.

The herein disclosed subject matter is to be considered descriptive and illustrative only, and the appended Claims are of a scope intended to cover and encompass not only the particular embodiments disclosed, but also equivalent structures, methods, and/or uses. Therefore, those skilled in the art will readily appreciate that various modifications or various devices including the solid-state imaging device may be made in these exemplary embodiments without materially departing from the principles and spirit of the inventive concept, the scope of which is defined in the appended Claims and their equivalents.

For example, a movie camera including the solid-state imaging device is included in one or more exemplary embodiments.

Moreover, in one or more exemplary embodiments, when viewed from above the semiconductor substrate, the output line running parallel to the charge transfer line that is connected to the lower electrode may be disposed on either side of the charge transfer line instead of being disposed to surround the charge transfer line. For example, when viewed from above the semiconductor substrate, the output line may comprise two lines made of linear shapes that are parallel to each other and that are disposed on either side of the charge transfer line. Moreover, when viewed from above the semiconductor substrate, the output line may comprise a line made of two linear shapes that are disposed to sandwich (surround) from two directions of a vertical direction and a horizontal direction and that are adjacent to each other and cross each other. In other words, the output line may comprise an L-shaped line. Also in this case, since the area is large where the lower electrode and the output line are facing each other, it is possible to reduce parasitic capacitance between (i) the lower electrode and the charge transfer line and (ii) the output line. As a result, in recent years, also in a wiring structure in which wiring width, wiring space in the same wiring layer, and wiring space between the stacked wiring layers have narrow pitches, it is possible to make parasitic capacitance between (i) the lower electrode and the charge transfer line and (ii) the output line relatively small, and to further increase S/N by increasing conversion efficiency of a signal charge.

Moreover, in the aforementioned embodiments, the output line may be formed to have a width greater than a width of another line in the pixel (the width in the plane that is parallel to the main surface of the lower electrode is large). In this case, since the area becomes large where the lower electrode and the output line are facing each other, it is possible to suppress the generation of parasitic capacitance with another line in the pixel, and to further increase S/N.

Moreover, the aforementioned embodiments describe an example of the case where a solid-state imaging device has a one-pixel one-cell structure in which one element necessary for the solid-state imaging device such as a photoelectric conversion film is included in each pixel. However, it is possible to use a so-called multiple-pixel one-cell structure in which output from a plurality of photoelectric conversion films is driven by a single transistor.

Moreover, in the above embodiments, one pixel is a square, and a plurality of pixels are arranged in an array. However, the above embodiments are not limited to this configuration. For example, it is possible to use a configuration in which the arrangement of pixels is a staggered arrangement or is obtained through mirror reversal.

Moreover, in the above embodiments, the wiring layer is a layer that is located at almost the same height from the surface of the semiconductor substrate, and a layer in which a plurality of lines are arranged. For example, the lines in the same wiring layer are formed in the same process.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

One or more exemplary embodiments disclosed herein are applicable to a solid-state imaging device that requires high S/N images as an imaging device such as a digital still camera.

The invention claimed is:

1. A solid-state imaging device comprising
a semiconductor substrate, and
a plurality of pixels two-dimensionally arranged, each of the plurality of pixels including:
   a photoelectric converter configured to photoelectrically convert incident light to charge, the photoelectric converter comprising an upper electrode, a lower electrode, and a photoelectric conversion film between the upper electrode and the lower electrode, the photoelectric converter located above the semiconductor substrate;
   an amplifying transistor that outputs a signal according to an amount of the charge from the photoelectric converter, the amplifying transistor including a part of the semiconductor substrate;
   a charge transfer line that connects the lower electrode and the amplifying transistor; and
   an output line that outputs a signal from the amplifying transistor, wherein
at least a part of the output line overlaps the lower electrode without another line between the part of the output line and the lower electrode.

2. The solid-state imaging device according to claim 1, wherein the output line is in a first wiring layer closest to the lower electrode.

3. The solid-state imaging device according to claim 1, wherein
the output line is in a second wiring layer second closest to the lower electrode, and
another line is disposed in a first wiring layer closest to the lower electrode.

4. The solid-state imaging device according to claim 1, wherein the output line is on either side of the charge transfer line.

5. The solid-state imaging device according to claim 1, wherein the output line has a width greater than a width of another line.

6. The solid-state imaging device according to claim 1, wherein the output line is between the lower electrode and the semiconductor substrate.

7. A solid-state imaging device comprising
a plurality of pixels two-dimensionally arranged,
each of the plurality of pixels including:
   a photoelectric converter configured to photoelectrically convert incident light to charge, the photoelectric converter comprising an upper electrode, a lower electrode, and a photoelectric conversion film between the upper electrode and the lower electrode, the lower electrode being in direct contact with the photoelectric conversion film;
   an amplifying transistor that outputs a signal according to an amount of the charge from the photoelectric converter;
   a charge transfer line that connects the lower electrode and the amplifying transistor; and
   an output line that outputs a signal from the amplifying transistor, wherein
at least a part of the output line overlaps the lower electrode without another line between the part of the output line and the lower electrode.

8. The solid-state imaging device according to claim 7, wherein the output line is in a first wiring layer closest to the lower electrode.

9. The solid-state imaging device according to claim 7, wherein
the output line is in a second wiring layer second closest to the lower electrode, and
another line is in a first wiring layer closest to the lower electrode.

10. The solid-state imaging device according to claim 7, wherein the output line is on either side of the charge transfer line.

11. The solid-state imaging device according to claim 7, wherein the output line has a width greater than a width of another line.

* * * * *